United States Patent
Nakagawa et al.

(10) Patent No.: US 9,368,838 B2
(45) Date of Patent: Jun. 14, 2016

(54) BATTERY MODULE PROVIDING FOR DISCONNECTION OF AN ABNORMAL CELL

(71) Applicant: PANASONIC CORPORATION, Osaka (JP)

(72) Inventors: Takashi Nakagawa, Osaka (JP); Toshiki Itoi, Nara (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 612 days.

(21) Appl. No.: 13/753,173

(22) Filed: Jan. 29, 2013

(65) Prior Publication Data

US 2013/0143101 A1 Jun. 6, 2013

Related U.S. Application Data

(63) Continuation of application No. PCT/JP2011/002017, filed on Apr. 5, 2011.

(30) Foreign Application Priority Data

Jul. 29, 2010 (JP) ................................. 2010-170788

(51) Int. Cl.
*H01M 6/42* (2006.01)
*H01M 10/42* (2006.01)
*B60L 11/18* (2006.01)
*H01M 2/20* (2006.01)
(Continued)

(52) U.S. Cl.
CPC ....... *H01M 10/4207* (2013.01); *B60L 11/1877* (2013.01); *H01M 2/204* (2013.01);
(Continued)

(58) Field of Classification Search
CPC ... B60L 11/1877; H01M 2/204; H01M 2/206; H01M 2/30; H01M 10/0525; H01M 10/4207; H02J 7/0029; G01R 31/3658; G01R 31/025; Y02T 10/705; Y02T 10/7011; Y02T 10/7005; Y02E 60/122
USPC .......................................................... 429/157
See application file for complete search history.

(56) References Cited

U.S. PATENT DOCUMENTS

| | | | |
|---|---|---|---|
| 6,051,955 | A | 4/2000 | Saeki et al. |
| 7,671,565 | B2 | 3/2010 | Straubel et al. |

(Continued)

FOREIGN PATENT DOCUMENTS

| | | |
|---|---|---|
| JP | 05-250979 A | 9/1993 |
| JP | 2002-142353 A | 5/2002 |

(Continued)

OTHER PUBLICATIONS

Extended European Search Report issued in European Application No. 11811957.7 dated Apr. 1, 2015.

(Continued)

*Primary Examiner* — Gary Harris
(74) *Attorney, Agent, or Firm* — McDermott Will & Emery LLP

(57) ABSTRACT

A battery module is configured such that n series blocks 20, each having m cells 10 connected in series, are connected in parallel. Adjacent cells 10 are connected in parallel via a first fusible link 30. One end of each of the series block 20 is connected to an input/output terminal 50 via a second fusible link 40. The number m of the cells 10 and the number n of the series blocks satisfy the formulas (1) and (2):

$$m \leq \tfrac{1}{2}[V_c/R_c \cdot I_{f1} - R_{f1}/R_c + 3] \quad (1)$$

$$n \geq (V_c + I_{f2} \cdot R_c)/[V_c - (m-1)I_{f2} \cdot R_c] \quad (2)$$

where $V_c$ and $R_c$ represent an electromotive voltage and an internal resistance of the cell 10, respectively; $R_{f1}$ and $I_{f1}$ represent a resistance and a fuse current of the first fusible link 30, respectively; and $I_{f2}$ represents a fuse current of the second fusible link 40.

8 Claims, 11 Drawing Sheets

(51) Int. Cl.
  *H01M 2/30* (2006.01)
  *H01M 10/0525* (2010.01)
  *H02J 7/00* (2006.01)
  *G01R 31/36* (2006.01)
  *G01R 31/02* (2006.01)

(52) U.S. Cl.
  CPC .............. *H01M 2/206* (2013.01); *H01M 2/30* (2013.01); *H01M 10/0525* (2013.01); *H02J 7/0029* (2013.01); *G01R 31/025* (2013.01); *G01R 31/3658* (2013.01); *Y02E 60/122* (2013.01); *Y02T 10/705* (2013.01); *Y02T 10/7005* (2013.01); *Y02T 10/7011* (2013.01)

(56) References Cited

U.S. PATENT DOCUMENTS

| | | |
|---|---|---|
| 2005/0158619 A1 | 7/2005 | Honda et al. |
| 2007/0188147 A1 | 8/2007 | Straubel et al. |
| 2011/0008655 A1* | 1/2011 | White et al. .................. 429/62 |
| 2011/0043036 A1* | 2/2011 | Weir ...................... H01R 13/68 307/43 |

FOREIGN PATENT DOCUMENTS

| | | |
|---|---|---|
| JP | 2004-031268 A | 1/2004 |
| JP | 2004-103483 A | 4/2004 |
| WO | WO-2010/008026 A2 | 1/2010 |
| WO | 2011/022647 A2 | 2/2011 |

OTHER PUBLICATIONS

International Search Report, and partial translation thereof, issued in International Patent Application No. PCT/JP2011/002017 mailed Jul. 19, 2011.

* cited by examiner

FIG.5
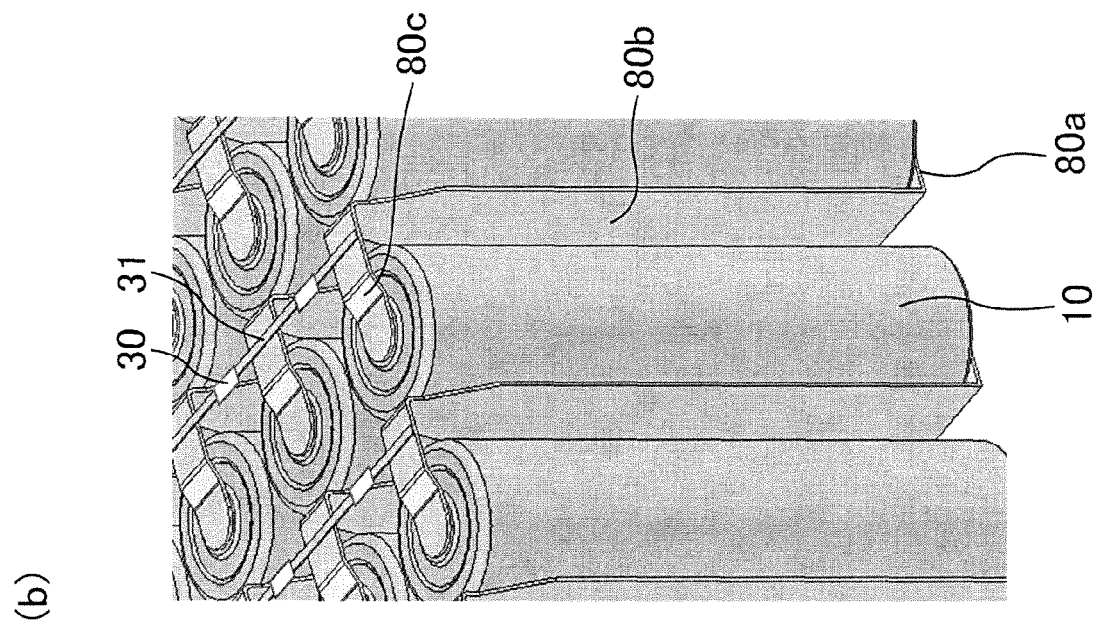
(a)
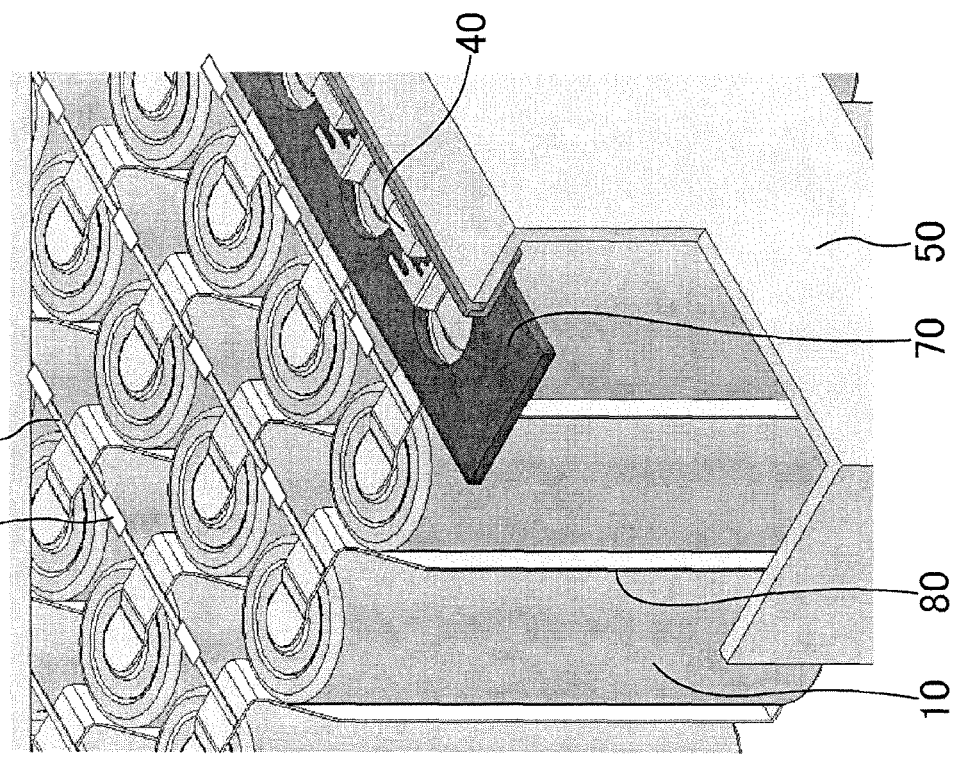
(b)

BATTERY MODULE PROVIDING FOR DISCONNECTION OF AN ABNORMAL CELL

RELATED APPLICATIONS

This application is the Continuation of International Application No. PCT/JP2011/002017 filed on Apr. 5, 2011, which in turn claims the benefit of Japanese Application No. 2010-170788, filed on Jul. 29, 2010, the disclosures of which Applications are incorporated by reference herein.

TECHNICAL FIELD

The present disclosure relates to battery modules in which a plurality of batteries are arranged in a matrix.

BACKGROUND ART

Battery packs including a plurality of batteries accommodated in a case, and capable of outputting predetermined voltage and current are widely used as power sources of various devices, vehicles, etc. Specifically, a technique in which general-purpose batteries (for example, cylindrical secondary batteries used in notebook computers) are connected together in parallel and/or in series to obtain modules of battery assemblies for outputting predetermined voltage and current, and these battery modules are combined together to be applicable to various applications, is beginning to be used. This modular technique can reduce the size and weight of the battery modules themselves by increasing the performance of the batteries accommodated in the battery modules. Thus, this modular technique has various advantages, such as an increase in workability in assembling a battery pack, and improvement in flexibility in mounting the battery module in areas of limited space, such as a vehicle.

Here, if a battery included in the battery module becomes unable to serve as a battery due to overcharge or overdischarge, or due to an internal short-circuit or external short-circuit, the abnormal battery may function as a resistor, and the performance of the battery module as a whole may be reduced significantly.

In view of this problem, Patent Document 1 discloses a battery assembly in which a plurality of series cell units, each including a plurality of cells connected in series, are connected in parallel. In this battery assembly, a resistor is provided between the cells adjacent to each other in the parallel direction. In this structure, in the event that an abnormal condition, such as an internal short-circuit, occurs in a cell, the resistor can reduce a current which flows into the abnormal cell.

However, since the abnormal cell cannot be disconnected from the battery assembly in this structure, it is not possible to sufficiently prevent a reduction in performance of the battery assembly as a whole.

In view of this, Patent Document 2 discloses a battery assembly in which a plurality of series battery groups, each including a plurality of batteries connected in series, are connected in parallel. In this battery assembly, a current bypass circuit is connected in parallel to each of the series battery groups, and a fuse is connected in series to each of the series battery groups and the current bypass circuit. In this structure, in the event that an abnormal condition occurs in a cell, the abnormal condition is detected and a high current is supplied to the current bypass circuit battery to melt the fuse, thereby making it possible to disconnect the series battery group including the abnormal battery from the battery assembly.

However, in this structure, the number of components may be increased because the current bypass circuit which operates when an abnormal battery is detected needs to be provided for each of the series battery groups. Further, since the batteries adjacent to each other in the parallel direction are not connected to each other in parallel, battery charge condition in charging the battery assembly may vary according to the series battery groups, which may lead to a reduction in performance of the battery assembly as a whole.

In view of this problem, Patent Document 3 discloses an assembled battery in which a plurality of batteries are connected together in parallel via connecting members. In this assembled battery, the positive electrode and the negative electrode of each of the batteries are connected to the connecting member by a fusible link. In this structure, in the event that an abnormal condition occurs in a battery, the fuse connected to the abnormal battery is melted due to overcurrent. Thus, the abnormal battery can be electrically disconnected from the other batteries.

CITATION LIST

Patent Document

Patent Document 1: Japanese Patent Publication No. 2004-31268

Patent Document 2: Japanese Patent Publication No. 2002-142353

Patent Document 3: U.S. Pat. No. 7,671,565

SUMMARY OF THE INVENTION

Technical Problem

In the case where a battery module is configured by arranging a lot of general-purpose batteries, a plurality of batteries are connected together in parallel to form a battery assembly, and a plurality of battery assemblies are connected together in series so that predetermined voltage and current are output.

For example, in the case where a plurality of battery assemblies of Patent Document 3 are connected together in series to form a battery module, a battery group which includes an abnormal battery can be reliably disconnected, whichever the abnormal battery is, because the fusible link is provided for each of the batteries.

However, the battery group in which the batteries are connected in series includes resistors connected in series to each of the batteries by a fusible link, which may lead to a reduction in performance of the battery module. Further, the number of components may be increased because the same number of fusible links as the number of the batteries needs to be provided.

The present disclosure is made in view of the above problems, and it is one of main objectives of the invention to provide a highly safe battery module including a plurality of batteries arranged in a matrix, in which even if an abnormal condition occurs in a battery included in the battery module, a battery group of serially-connected batteries that includes the abnormal battery is reliably disconnected from the other battery groups, and a reduction in performance of the battery module as a whole is prevented.

Solution to the Problem

To solve the above problems, a battery module of the present disclosure in which a plurality of series blocks, each including a plurality of cells connected in series, are connected in parallel, is configured such that the cells arranged in a parallel direction are connected in parallel via a fusible link, and such that a fusible link is connected to one end of each of the series blocks, and the number of arrangements of the cells is set to a number which, even in the event that an abnormal condition has occurred in a battery included in the battery module, enables the series block including the abnormal battery to be reliably disconnected.

Specifically, a battery module according to the present disclosure is a battery module having a plurality of cells arranged in a matrix, wherein m cells are connected in series in a column direction to form a series block, the series block includes n series blocks arranged in a row direction, and the cells adjacent to each other in the row direction are connected in parallel via a first fusible link, the cell located at one end of each of the series blocks is connected to a common input/output terminal via a second fusible link, and the number m of the cells arranged in the column direction and the number n of the cells arranged in the row direction satisfy the following formulas (1) and (2).

[formula 1]

$$m \le \frac{1}{2}\left(\frac{V_c}{R_c I_{f1}} - \frac{R_{f1}}{R_c} + 3\right) \quad (1)$$

[formula 2]

$$n \ge \frac{V_c + I_{f2} R_c}{V_c - (m-1) I_{f2} R_c} \quad (2)$$

where $V_c$ represents an electromotive voltage of the cell; $R_c$ represents an internal resistance of the cell; $R_{f1}$ represents a resistance of the first fusible link; $I_{f1}$ represents a fuse current of the first fusible link; and $I_{f2}$ represents a fuse current of the second fusible link.

In this battery module which has cells arranged in an m×n matrix satisfying the formulas (1) and (2), even in the event that an abnormal condition has occurred in a cell included in the battery module, it is possible to disconnect the series block including the abnormal cell from the battery module with reliability. Further, since the series block does not include series resistances, such as a plurality of fusible links, a reduction in performance of the battery module can be prevented.

Advantages of the Invention

According to the present disclosure, it is possible to provide a highly safe battery module including a plurality of cells arranged in a matrix, in which even if an abnormal condition occurs in a cell included in the battery module, a battery group (a series block) of serially-connected batteries that includes the abnormal battery can be reliably disconnected from the battery module, and a reduction in performance of the battery module as a whole is prevented.

BRIEF DESCRIPTION OF THE DRAWINGS

FIGS. 5(a) and 5(b) show enlarged views of parts of the battery module shown in FIG. 4.

DESCRIPTION OF EMBODIMENTS

Embodiments of the present disclosure will be described in detail below based on the drawings. The present disclosure is not limited to the following embodiments. Further, the embodiments can be modified appropriately without deviating from the effective scope of the present disclosure, and can be combined with other embodiments.

First Embodiment

Figure 1:
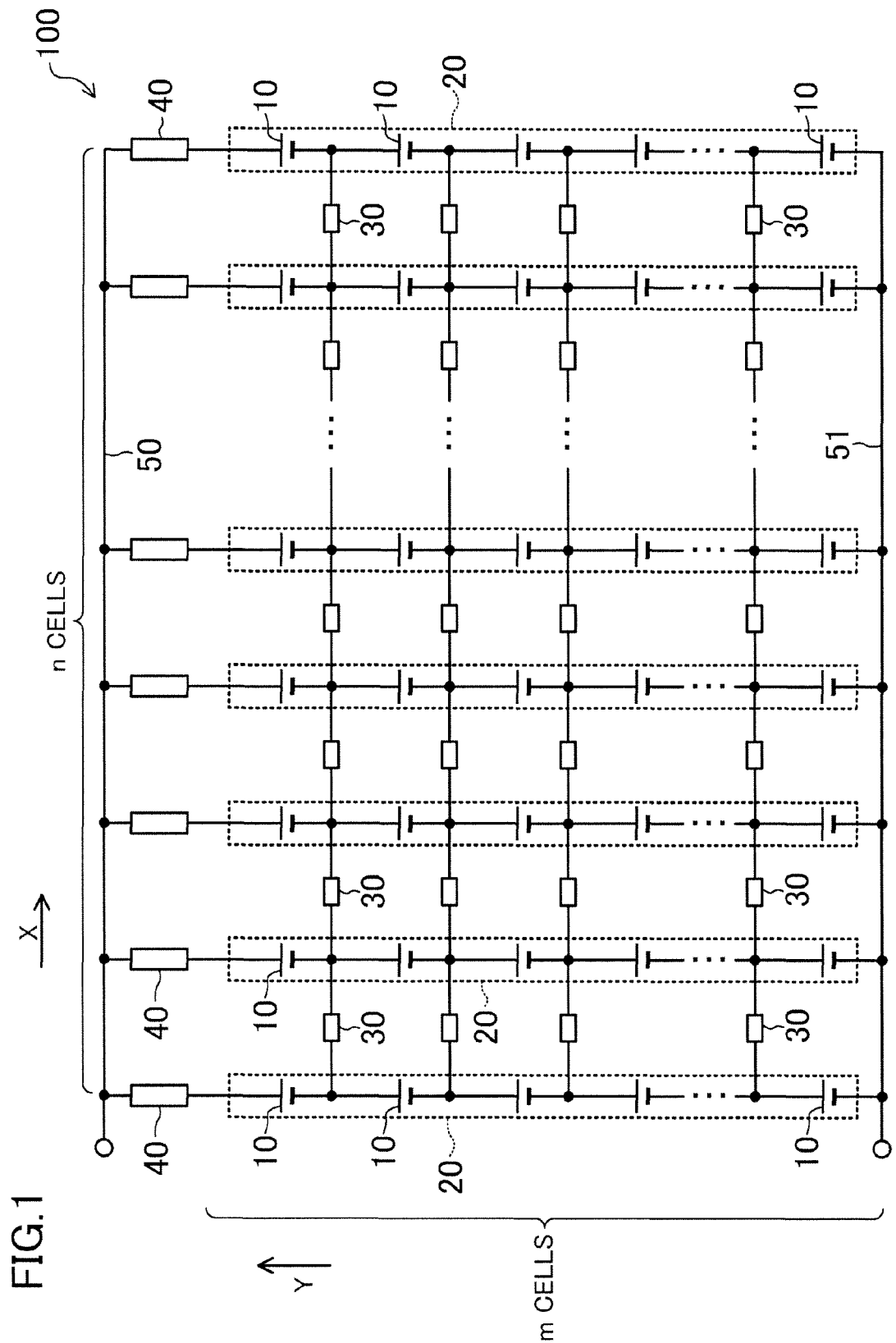
FIG. 1 is an equivalent circuit diagram schematically illustrating a configuration of a battery module according to the first embodiment of the present disclosure.

FIG. 1 is an equivalent circuit diagram schematically illustrating a configuration of a battery module 100 according to the first embodiment of the present disclosure.

As shown in FIG. 1, the battery module 100 of the present embodiment includes plurality of batteries (hereinafter simply referred to as "cells") arranged in a matrix. Types of the cells 10 of the present disclosure are not specifically limited as long as the cells 10 are secondary batteries which can be charged and discharged. For example, lithium ion batteries, nickel hydrogen batteries may be used. Further, the secondary batteries may be a battery which can be used independently as a power source of a portable electric device, such as a notebook computer. In this case, high-performance, general-purpose batteries can be used as the cells of the battery module, and it is thus possible to improve the performance of the battery module, and reduce the cost of the battery module more easily.

In the battery module 100 of the present embodiment, m cells 10 are connected together in series in a column direction (i.e., Y direction) to form a series block 20. The series block 20 includes n series blocks 20 arranged in a row direction (i.e., X direction), and the cells 10 adjacent to each other in the row direction are connected together in parallel via a first fusible link 30. Further, the cell 10 on one end of each of the series blocks 20 is connected to a common input/output terminal 50 via a second fusible link 40. In the present embodiment, the positive electrode terminal of the cell 10 located on one end of each of the series blocks 20 is connected to the input/output terminal (a positive electrode input/output terminal) 50 via the second fusible link 40, and the negative electrode terminal of the cell 10 located on the other end of each of the series blocks 20 is connected to a negative electrode input/output terminal 51.

In the present embodiment, the second fusible link 40 is located closer to the positive electrode terminal of the cell 10 on one end of the series block 20, but the second fusible link 40 may be located closer to the negative electrode terminal of the cell 10 on the other end of the series block 20. Further, the term "row direction (X direction)" and the term "column direction (Y direction)" are used to specify the connection direction of the cells 10 in parallel and the connection direction of the cells 10 in series, respectively, for the purpose of convenience, and they are not intended to have other meanings.

The term "fusible link" as used in the present disclosure refers to a connecting means having a fuse function which is melted when a current reaches a predetermined value, and the configuration of the fusible link is not specifically limited.

The battery module of the present disclosure is configured such that n series blocks 20, each including m cells 10 connected in series in the column direction, are connected in the row direction. If this is explained by looking at the arrangement of the cells 10, the battery module is configured by (m×n) cells 10 arranged in a matrix.

In the event that an abnormal condition, such as an internal short-circuit, occurs in a cell 10 included in the battery module 100, it is necessary to reliably disconnect the series block 20 including the abnormal battery from the other series blocks 20. To achieve the disconnection, not only the second fusible link 40 connected to the series block 20, but also all the first fusible links 30 connected to the cells 10 in the adjacent series blocks 20 need to be melted.

Here, the values of fuse currents of the first and second fusible links 30, 40 are set to values at which the first and second fusible links 30, 40 are melted by a short-circuit current flowing in the fusible links 30, 40 in the event that an abnormal condition occurs in a cell 10. For example, in the case of the battery module as disclosed in Patent Document 3 in which fusible links are connected in series to each of the cells 10, the fuse current of the fusible links may be set to a value of a short-circuit current of the cell 10.

However, in the battery module 100 as in the present disclosure in which one fusible link 40 is provided at each of the series blocks 20, the short-circuit current flowing in the first fusible link 30 located between the cells 10 connected to each other in parallel differs according to the location of the first fusible link 30 relative to the abnormal cell 10 in the matrix. Thus, the fuse currents of the first and second fusible links 30, 40 cannot be simply set to values of the short-circuit current of the cell 10. Therefore, in such a case, the fuse currents of the first and second fusible links 30, 40 may be set, for example, to about two to three times the current value obtained by dividing the maximum current in the battery module 100 by the number of arrangements of the cells 10 arranged in parallel, in view of the current flowing in the circuit of the battery module 100 during a normal operation.

However, if the first and second fusible links 30, 40 (which are not melted during a normal operation) whose fuse currents are set constant are placed in the battery module 100 including the cells 10 arranged in a matrix without considering the number of arrangements of the cells 10 arranged in the row direction (X direction) and the column direction (Y direction) (i.e., m×n), there is a possibility that a short-circuit current flowing in the first and second fusible links 30, 40 located apart from the abnormal cell 10 does not reach the set fuse current.

Accordingly, the present disclosure is to give conditions of the number of arrangements of the cells 10 arranged in the row direction and the column direction (i.e., m×n) which are necessary for disconnecting the series block 20 including the abnormal cell 10 from the other series blocks 20 in the battery module 100 where the first and second fusible links 30, 40 whose fuse currents are set constant are placed.

Figure 2:
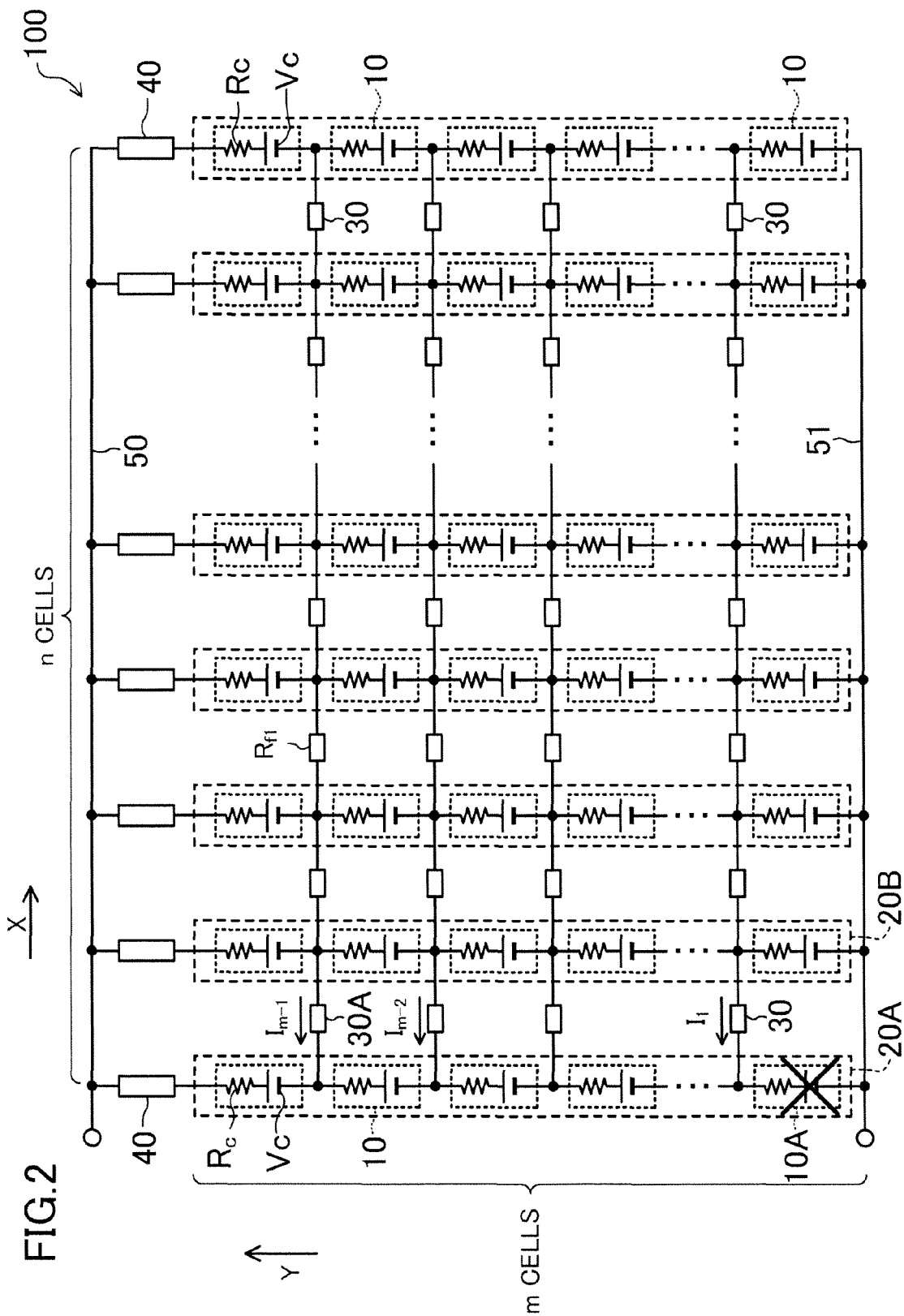
FIG. 2 is an equivalent circuit diagram in which a cell in the battery module shown in FIG. 1 is illustrated by an electromotive voltage $V_c$ and an internal resistance $R_c$.
Figure 3:
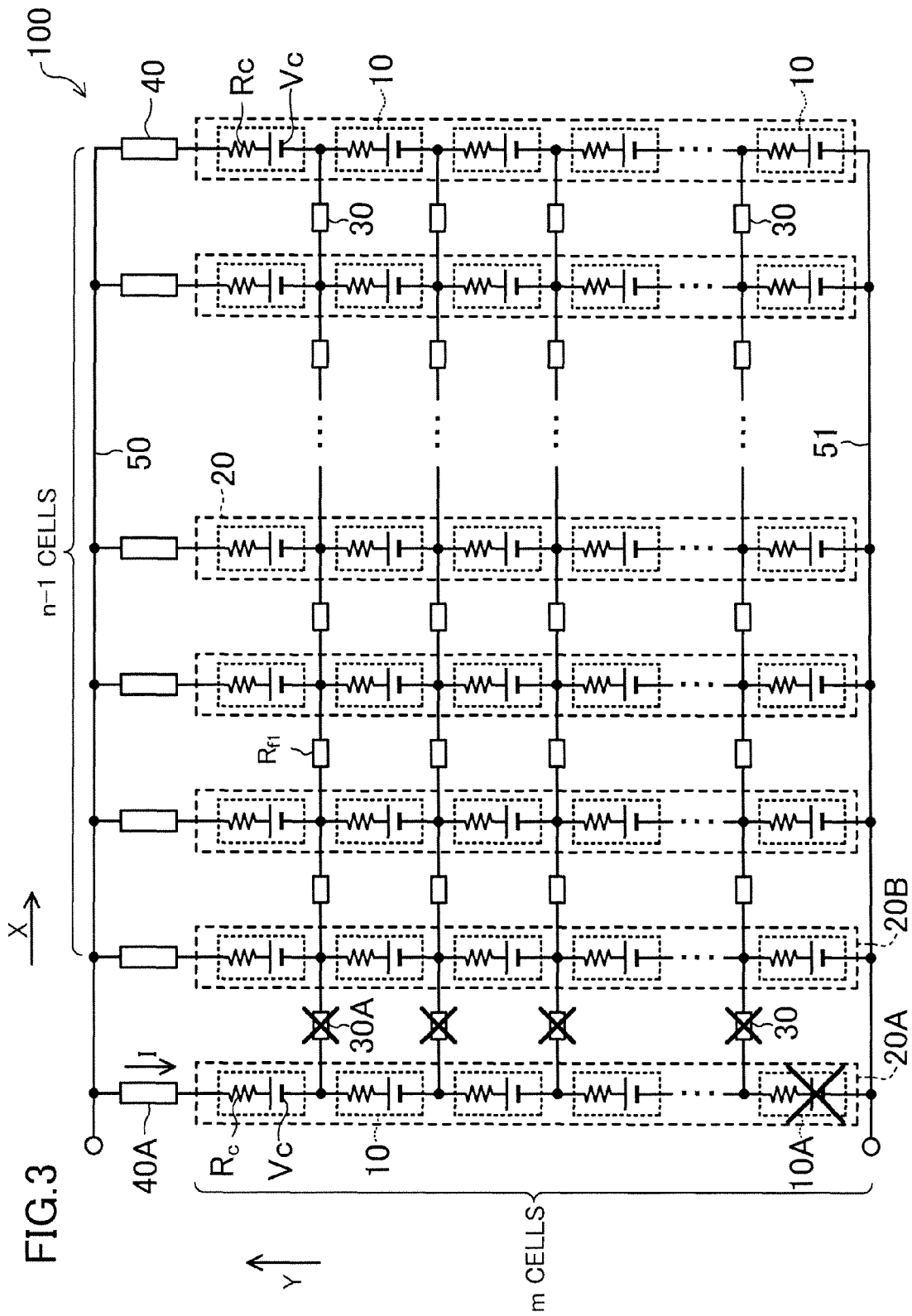
FIG. 3 is an equivalent circuit diagram in which a cell in the battery module shown in FIG. 1 is illustrated by an electromotive voltage $V_c$ and an internal resistance $R_c$.

The conditions will be described below with reference to FIG. 2 and FIG. 3. FIG. 2 and FIG. 3 show the battery module 100 with a configuration shown in FIG. 1. In FIG. 2 and FIG. 3, each cell 10 included in the series block 20 is illustrated using an electromotive voltage $V_c$ and an internal resistance $R_c$.

First, a case will be considered in which an abnormal condition has occurred in the cell 10A located at one end of the series block 20A as shown in FIG. 2. In this case, a short-circuit current flowing in the first fusible link 30 between the cells 10 in adjacent series blocks 20 connected together in parallel in the row direction (X direction) is increased with an increase in the number of parallel arrangements of the series block 20 from the series block 20A. In other words, the short-circuit current flowing in the first fusible links 30 between the series block 20A and the series block 20B adjacent to the series block 20A is the smallest. Further, among short-circuit currents flowing in the plurality of first fusible links 30 located between the series block 20A and the series block 20B, a short-circuit current flowing in the first fusible link 30A farthest from the abnormal cell 10A is the smallest. This means that if the first fusible link 30A that is farthest from the abnormal cell 10A is melted by the short-circuit current, all the other first fusible links 30 arranged in the column direction are melted. As a result, the series block 20A including the abnormal cell 10 is disconnected from the adjacent series block 20B with reliability.

Here, the short-circuit current flowing in the first fusible link 30A farthest from the abnormal cell 10A is referred to as $I_{m-1}$. In the case where all the first fusible links 30, other than the first fusible link 30A, which are arranged in the column direction are melted, the following formula (A) holds in the circuit comprised of the series block 20A and the series block 20B.

$$V_c = I_{m-1}(m-1)R_c + I_{m-1}R_{f1} + I_{m-1}(m-2)R_c \quad (A)$$

Here, the series block 20A includes (m−2) normal cells 10. The series block 20B includes (m−1) normal cells 10. The resistance of the first fusible link 30 is $R_{f1}$. The potential difference in the circuit is set to the electromotive voltage $V_c$ of the abnormal cell 10A (i.e., the internal resistance of the cell 10A is approximated to zero).

From the above formula (A), the short-circuit current $I_{m-1}$ flowing in the first fusible link 30A can be represented by the following formula (B).

$$I_{m-1} = V_c / [(2m-3)R_c + R_{f1}] \quad (B)$$

Accordingly, the following formula (C), where $I_{f1}$ represents the fuse current of the first fusible link 30, needs to be satisfied so that the first fusible link 30A may be melted by the short-circuit current.

$$I_{m-1} = V_c / [(2m-3)R_c + R_{f1}] > I_{f1} \quad (C)$$

If this formula (C) is expanded with respect to m, the following formula (1) is obtained.

[Formula 1]

$$m \leq \frac{1}{2}\left(\frac{V_c}{R_c I_{f1}} - \frac{R_{f1}}{R_c} + 3\right) \quad (1)$$

That is, according to this formula where $R_c$ represents the resistance of a first fusible link 30 connecting adjacent cells 10 included in the series blocks 20 connected in parallel in the row direction, and $I_{f1}$ represents the fuse current of the first fusible link 30, the series block including the abnormal cell 10 can be reliably disconnected from the adjacent series block by setting the number m of the cells 10 connected in series in the column direction and comprising the series block 20, to a number that satisfies the formula (1). As known from the formula (1), the maximum number m of the cells 10 capable of being connected in series in the series block 20 does not depend on the number n of the series blocks 20 connected in parallel in the row direction.

Next, conditions for further melting the second fusible link 40A connected to the series block 20A, and disconnecting the series block 20A from the input/output terminal 50 with reliability, when the series block 20A which includes the serially-connected m cells 10 satisfying the formula (1) is reliably disconnected from the adjacent series block 20B as shown in FIG. 3, will be described.

As shown in FIG. 3, a current flowing in the series block 20A including the abnormal cell 10A (i.e., a current flowing in the second fusible link 40A) is represented by the character I. Since each cell 10 has the same electromotive voltage and the same internal resistance, the current I flowing in the series block 20A is equalized, i.e., I/(n−1), to flow in the (n−1) series blocks 20 other than the series block 20A.

In the circuit comprised of the series block 20A which includes (m−1) normal cells 10, and the series block 20B which includes m normal cells 10, the potential difference between the series block 20A and the series block 20B is an electromotive voltage $V_c$ of the abnormal cell 10A. Thus, the following formula (D) holds.

$$C_c = I(m-1)R_c + I/(n-1)mR_c \quad (D)$$

From the formula (D), the short-circuit current I flowing in the second fusible link 40A is expressed by the following formula (E).

$$I = V_c/R_c[(m-1)+m/(n-1)] \quad (E)$$

Accordingly, the following formula (F), where $I_{f2}$ represents the fuse current of the second fusible link 40, needs to be satisfied so that the second fusible link 40A may be melted by the short-circuit current.

$$I = V_c/R_c[(m-1)+m/(n-1)] > I_{f2} \quad (F)$$

If this formula (F) is expanded with respect to n, the following formula (2) is obtained.

[Formula 2]

$$n \geq \frac{V_c + I_{f2}R_c}{V_c - (m-1)I_{f2}R_c} \quad (2)$$

That is, according to this formula where $I_{f2}$ represents the fuse current of the second fusible link 40 connecting the cell 10 on the one end of the series block 20 which includes serially-connected m cells 10 satisfying the formula (1) to the input/output terminal 50, the series block 20 including the abnormal cell 10 can be reliably disconnected from the input/output terminal 50 by setting the number n of the series blocks 20 connected in parallel in the row direction, to a number that satisfies the formula (2).

As described above, the battery module 100 of the present embodiment is configured such that m cells 10 are connected in series in the column direction to form the series block 20; n series blocks 20 are arranged in the row direction; and the cells 10 adjacent to each other in the row direction are connected together in parallel via the first fusible link 30. The cell 10 on one end of each of the series blocks 20 is connected to the common input/output terminal 50 via the second fusible link 40. The number m of the cells 10 arranged in the column direction, and the number n of the series blocks 20 arranged in the row direction satisfy the following formulas (1) and (2).

[Formula 1]

$$m \leq \frac{1}{2}\left(\frac{V_c}{R_c I_{f1}} - \frac{R_{f1}}{R_c} + 3\right) \quad (1)$$

[Formula 2]

$$n \geq \frac{V_c + I_{f2}R_c}{V_c - (m-1)I_{f2}R_c} \quad (2)$$

In the above formulas, $V_c$ represents an electromotive voltage of the cell; $R_c$ represents an internal resistance of the cell; $R_{f1}$ represents a resistance of the first fusible link; $I_{f1}$ represents a fuse current of the first fusible link; and $I_{f2}$ represents a fuse current of the second fusible link.

The series block 20 of serially-connected batteries that include the abnormal cell 10 can be reliably disconnected from the battery module 100 by configuring the battery module 100 such that the number of arrangements in a matrix (m×n) may satisfy the above formulas (1) and (2). As a result, it is possible to safely use the battery module 100, while maintaining parallel connection between normal series blocks 20.

In the present embodiment, the number of cells 10 arranged in a matrix (m×n) is set to satisfy the conditions of the above formulas (1) and (2). However, in the case where m and n are large numbers (e.g., m≥10 and n≥10), m can be approximate to m−1 (m−1≈m) and n can be approximate to n−1 (n−1≈n) in deriving the formulas (1) and (2). In this case, the formulas (1) and (2) can be approximated by the following formulas (3) and (4), respectively.

[Formula 3]

$$m \leq \frac{1}{2}\left(\frac{V_c}{R_c I_{f1}} - \frac{R_{f1}}{R_c}\right) \quad (3)$$

[Formula 4]

$$n \geq \frac{m I_{f2} R_c}{V_c - m I_{f2} R_c} \quad (4)$$

In the above formulas, $V_c$ represents an electromotive voltage of the cell; $R_c$ represents an internal resistance of the cell; $R_{f1}$ represents a resistance of the first fusible link; $I_{f1}$ represents a fuse current of the first fusible link; and $I_{f2}$ represents a fuse current of the second fusible link.

Figure 4:
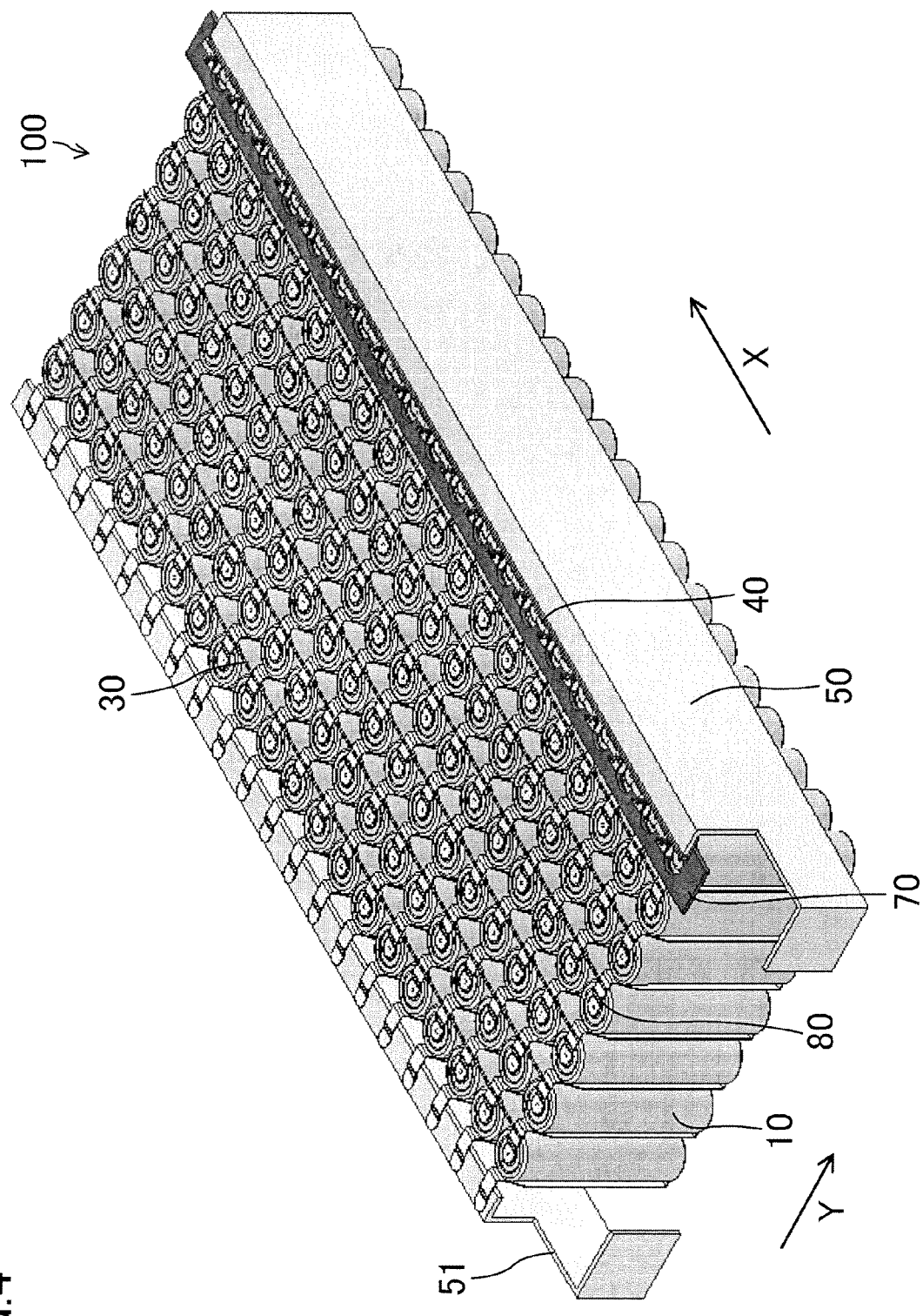
FIG. 4 is an oblique view of a configuration of the battery module according to the first embodiment.

Next, a concrete configuration of the battery module 100 of the present embodiment will be described with reference to FIG. 4 and FIG. 5. FIG. 4 is an oblique view of a configuration of the battery module 100 of the present embodiment. FIG. 5(a) and FIG. 5(b) show enlarged views of parts of the battery module 100 shown in FIG. 4.

As shown in FIG. 4, the battery module 100 includes a plurality of cells 10 arranged in a matrix. In the present embodiment, an example is shown in which one row (in the X direction) includes twenty cells 10, and one column (in the Y direction) includes seven cells 10. However, of course, the number of cells 10 arranged in a matrix is not limited.

As shown in FIG. 5(a) and FIG. 5(b), a connecting member 80 which connects, in series, between the cells 10 adjacent to each other in the column direction (Y direction) includes a portion 80a connected to a negative electrode terminal on the bottom of a cell 10 (e.g., a bottom surface of a battery case), a portion 80b extending from the bottom to the top of the cell 10 along a side surface of the cell 10, and a portion 80c extending from the top of the cell 10 to the top of a cell 10 adjacent to the cell 10, and connected to a positive electrode terminal of the adjacent cell 10 (e.g., a protrusion on a sealing plate of the battery case).

Further, as shown in FIG. 5(a) and FIG. 5(b), a connecting member 31 which connect the cells 10 arranged in the row direction (X direction) together in parallel is connected to the portion 80c of each connecting member 80 which connects between the cells 10 adjacent to each other in the column direction. A first fusible link 30 is inserted in the middle of the connecting member 31 connecting in parallel between the cells 10 adjacent to each other in the row direction. The first fusible link 30 may be made of a chip fuse, for example.

Further, as shown in FIG. 4, the endmost cells 10 among the cells 10 arranged in the column direction (Y direction) are connected to a positive electrode input/output terminal (e.g., a positive electrode bus bar) 50 and a negative electrode input/output terminal (e.g., a negative electrode bus bar) 51, respectively. As shown in FIG. 5(a), a circuit board 70 is provided on the top of the cells 10 closest to the positive electrode input/output terminal 50, and a second fusible link 40 is placed on the circuit board 70 between the cell 10 and the positive electrode input/output terminal 50. A control circuit which, for example, detects and control charge and discharge of the battery module 100, and voltages or temperatures of the cells 10 may be provided on the circuit board 70 in addition to the second fusible link 40.

Figure 6:
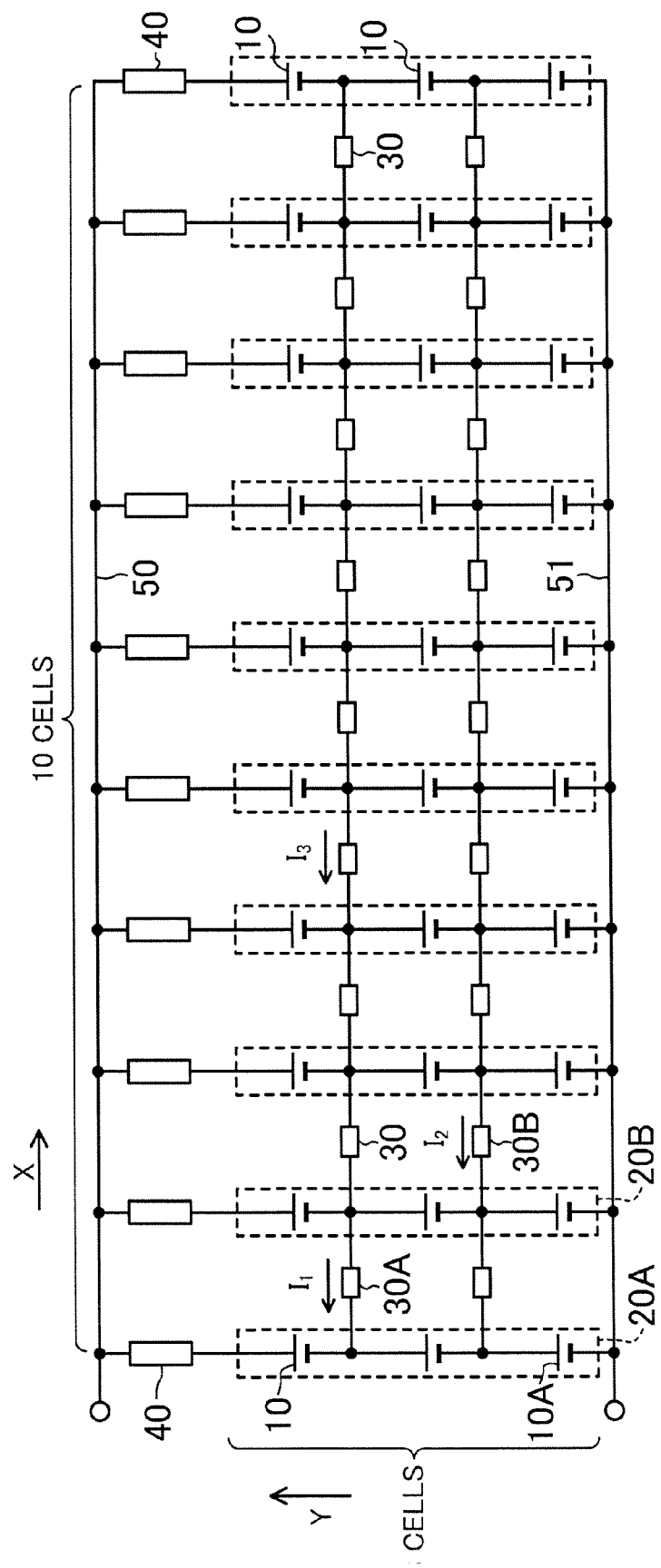
FIG. 6 is an equivalent circuit diagram illustrating a configuration of a battery module used in simulations.

Now, results of simulations of values of the current flowing in each of the first fusible links 30 in the battery module of the present embodiment will be described with reference to FIG. 6 and FIG. 7. FIG. 6 is an equivalent circuit diagram illustrating a configuration of the battery module used in the simulations, in which ten (n=10) series blocks 20, each including three (m=3) cells 10 connected together in series, are connected together in parallel. In the equivalent circuit shown in FIG. 6, a cell 10 is represented by a DC voltage source and an internal resistance, and a fusible link 30 is represented by a resistance. Further, a short circuit including a cell 10 in which an internal short-circuit has occurred is formed. In this state, values of a current flowing in the fusible link 30 were calculated using a Quite Universal Circuit Simulator (QUCS).

First, the minimum current value $I_1$ necessary to melt all the first fusible links 30 adjacent to the series block 20A including the abnormal cell 10A is determined. The current value $I_1$ is a value of the short-circuit current flowing in the first fusible link 30A farthest from the abnormal cell 10A.

Figure 7:
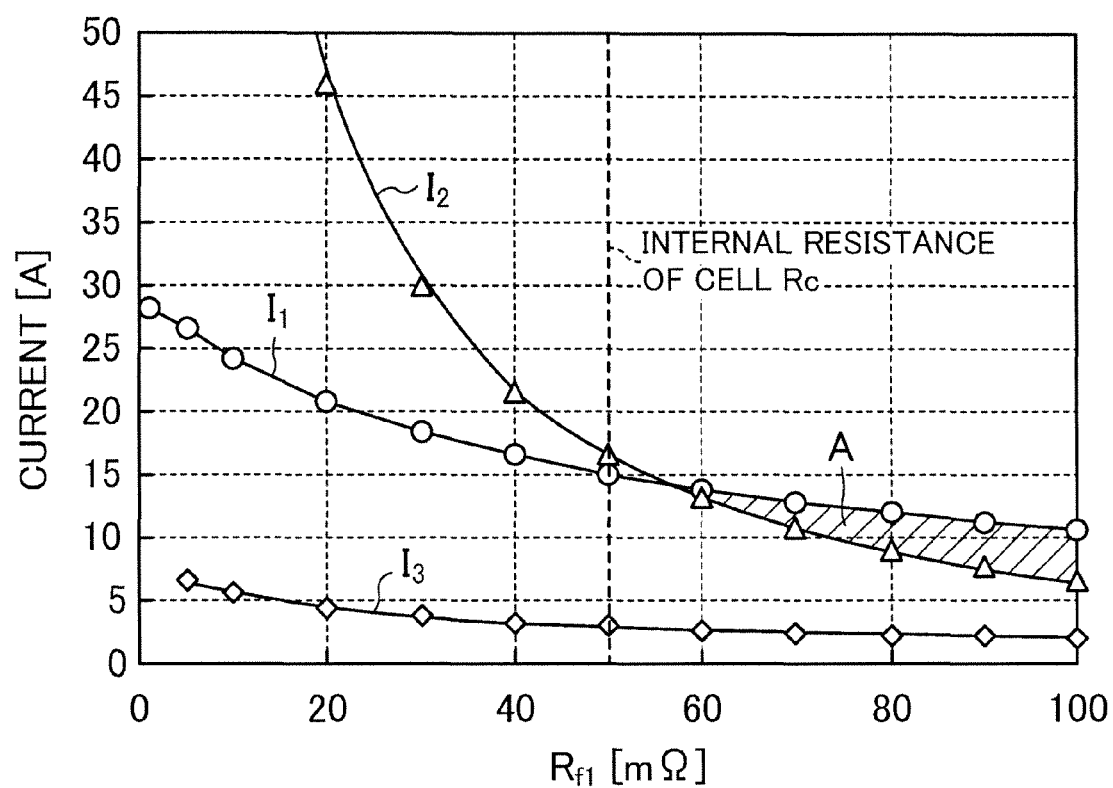
FIG. 7 is a graph showing a simulation result of current values flowing in a first fusible link.

FIG. 7 shows the results of simulations of the current value $I_1$ (the curve $I_1$) with various resistances $R_{f1}$ of the first fusible link 30. In the calculation, the electromotive voltage $V_c$ of the cell 10 was set to 4V; the internal resistance $R_c$ was set to 50 mΩ; and the internal resistance of the cell 10 in which an internal short-circuit had occurred was set to 0Ω. As shown in FIG. 7, the current value $I_t$ decreases with an increase in the resistance $R_{f1}$ of the first fusible link 30. By setting the fuse current of the first fusible link 30 to a value smaller than the values of curve $I_1$ shown in FIG. 7, it is possible to disconnect the series block 20A from the adjacent series block 20B with reliability.

Now, the maximum current value $I_2$ at which no first fusible links 30 connected to the series block 20B adjacent to the series block 20A including the abnormal cell 10A are melted is determined. Here, $I_2$ represents a value of the short-circuit current flowing in the first fusible link 30B closest to the abnormal cell 10A.

FIG. 7 shows the results of simulations of the current value $I_2$ (curve $I_2$) with various resistances $R_{f1}$ of the first fusible link 30. As shown in FIG. 7, the current value $I_2$ significantly decreases with an increase in the resistance $R_{f1}$ of the first fusible link 30. By setting the fuse current of the first fusible link 30 to a value larger than the values of the curve $I_2$ shown in FIG. 7, it is possible to prevent the first fusible links 30 which connect normal series blocks 20 in parallel from being melted. Accordingly, to reliably disconnect the series block 20A including the abnormal cell 10A from the adjacent series block 20B, and maintain parallel connection between the other series blocks 20 including the adjacent series block 20B, it is preferable to set the fuse current of the first fusible link 30 to a current value within a hatched range A shown in FIG. 7. The current values in the range A can be obtained when the resistance $R_{f1}$ of the first fusible link 30 is 60 mΩ or more. It is therefore preferable to set the resistance $R_{f1}$ of the first fusible link 30 to a value larger than the internal resistance $R_c$ (50 mΩ) of the cell 10.

Now, of the currents flowing between the first fusible links 30 during a normal operation, the maximum current $I_3$ which flows when the maximum potential difference of 0.5 V is generated between the cells 10 is determined. Variations of the potential differences between the normal cells 10 are in a range of about 0.02 V to 0.04 V.

FIG. 7 shows the results of simulations of the current value $I_3$ (curve $I_3$) with various resistances $R_{f1}$ of the first fusible link 30. As shown in FIG. 7, the current value $I_3$ does not significantly change even if the resistance $R_{f1}$ of the first fusible link 30 is varied. If the fuse current of the first fusible link 30 is set to a value larger than the values of the curve $I_3$ shown in FIG. 7, the first fusible link 30 is not melted by the equalized current flowing between the cells 10 connected in parallel. As a result, it is possible to prevent a reduction of the cycle characteristics even if charge and discharge of the battery module are repeated.

Second Embodiment

Figure 8:
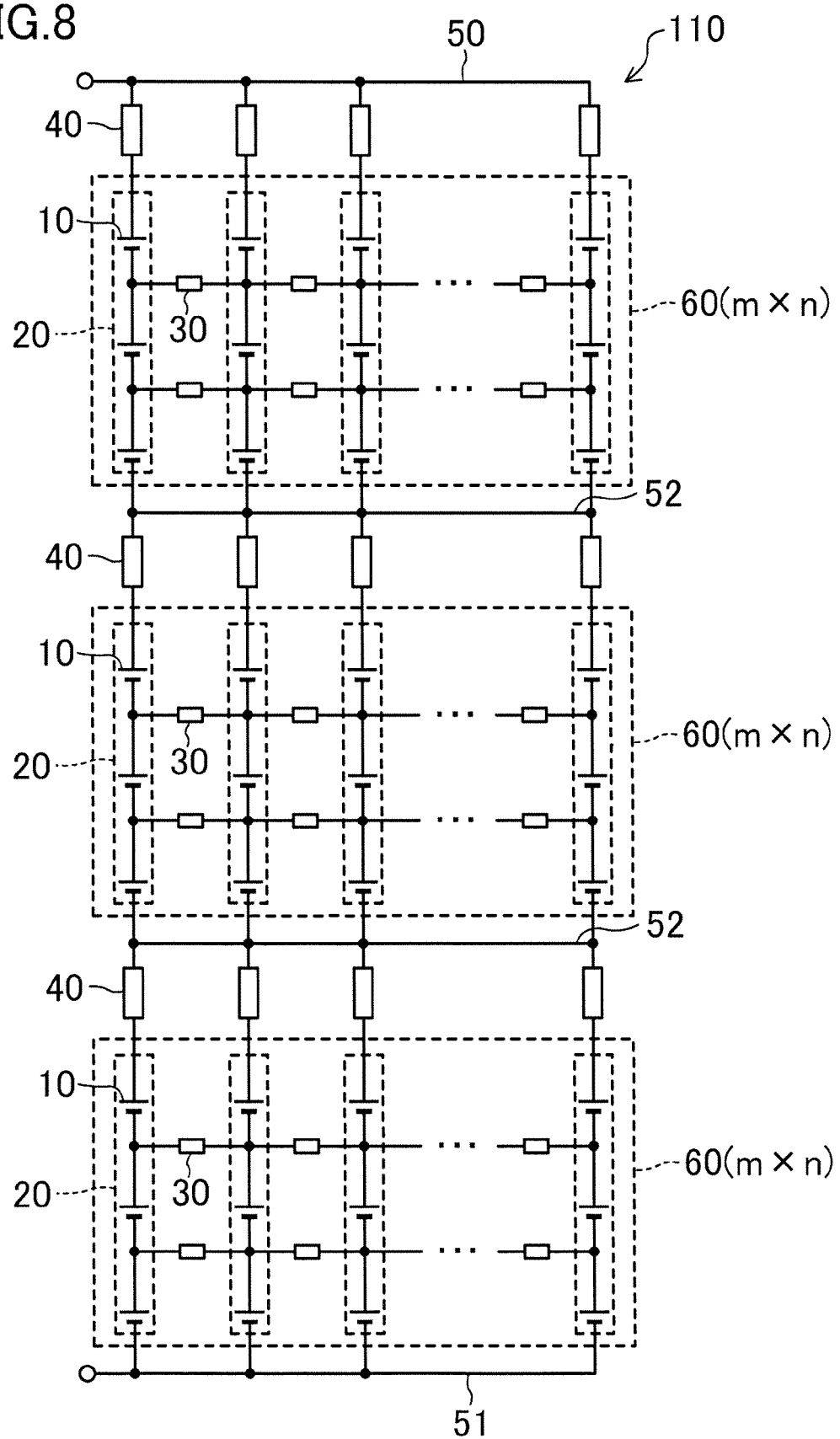
FIG. 8 is an equivalent circuit diagram schematically illustrating a configuration of a battery module according to the second embodiment of the present disclosure.

FIG. 8 is an equivalent circuit diagram schematically illustrating a configuration of a battery module 110 according to the second embodiment of the present disclosure.

To reliably disconnect the series block 20A including the abnormal cell 10 from the adjacent series block 20B and the input/output terminal 50 in the battery module 100 described in the first embodiment, the number m of the cells 10 arranged in the column direction, and the number n of the series blocks 20 arranged in the row direction need to be set to the numbers (m, n) which satisfy the conditions of the above formulas (1) and (2).

Of course, the numbers (m, n) derived from the formulas (1) and (2) may vary according to the internal resistance $R_c$ of the cell 10 used in the battery module 100, the resistance $R_{f1}$ of the first fusible link 30, etc., and in some cases, it may not be possible to provide the numbers (m, n) of the cells 10 necessary to satisfy the specifications of the battery module.

In the present embodiment, a configuration of the battery module 110 is suggested according to which the series block 20A including the abnormal cell 10 can be reliably disconnected from the other series blocks even in above cases.

As shown in FIG. 8, the battery module 110 of the present embodiment is configured such that a plurality of battery blocks 60 (three battery blocks 60 in FIG. 8), each being comprised of (m×n) cells 10 connected in series/parallel, are connected in series in the column direction. In each of the battery blocks 60 except for the battery block 60 connected to an input/output terminal 50, each of the cells 10 located on one end of the battery block 60 in the column direction is connected to a common block connecting member 52 via a second fusible link 40.

According to this battery module 110, in the event that an abnormal condition has occurred in a cell 10 included in one of the battery blocks 60, the series block 20 which includes the abnormal battery is reliably disconnected from the battery block 60, and all the series/parallel connections between the (m×n) cells 10 in the other battery blocks 60 can be maintained. As a result, it is possible to provide the battery module 110 in which the number of cells 10 is substantially increased.

Third Embodiment

Figure 9:
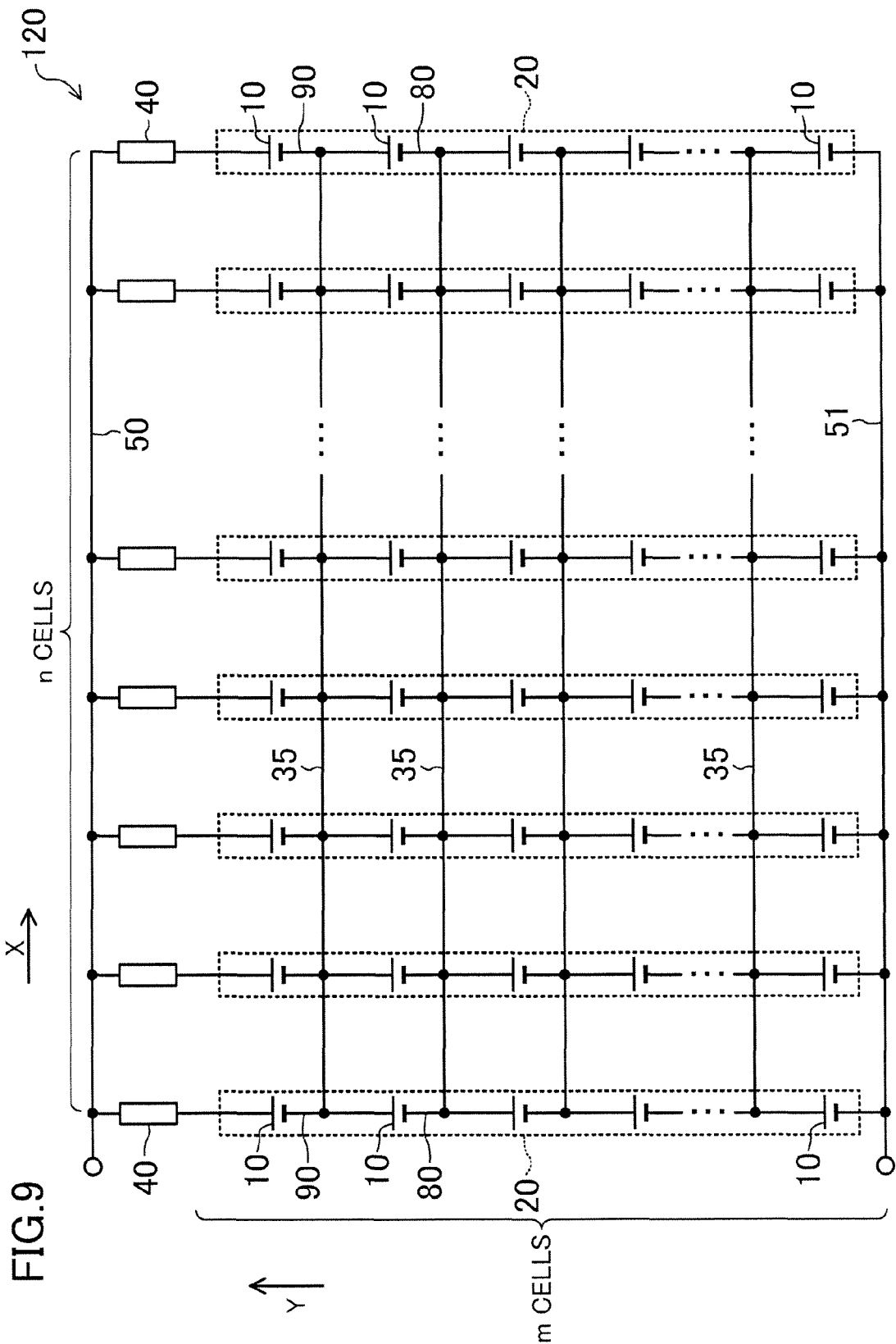
FIG. 9 is an equivalent circuit diagram schematically illustrating a configuration of a battery module 120 according to the third embodiment of the present disclosure.

FIG. 9 is an equivalent circuit diagram schematically illustrating a configuration of a battery module 120 according to the third embodiment of the present disclosure.

In the first embodiment, the first fusible link 30 may be made, for example, of a chip fuse, etc. In the present embodiment, the cells 10 arranged in the row direction (X direction) are connected in parallel by a first conductive material 35 as shown in FIG. 9, and the first conductive material 35 serves as a first fusible link 30.

Specifically, in the present embodiment, in the event that an internal short-circuit has occurred in a cell 10, the first conductive material 35 is melted by the Joule heat due to a short-circuit current flowing in the cell 10 in which the internal short-circuit has occurred, via the first conductive material 35.

The cells 10 arranged adjacent to each other in the column direction (Y direction) are connected in series by a second conductive material 90. The first conductive materials 35 are connected to each other by the second conductive materials 90 connecting the cells 10 adjacent to each other in the column direction.

Here, if the first conductive material 35 is made of a metal member having a uniform cross-sectional area (A), a temperature increase ΔT caused by the Joule heat (E) after time t has passed since a current (I) flowed in the first conductive material 35, can be calculated by the following formula (X).

$$\Delta T = E/(Cp \cdot M) \qquad (X)$$
$$= (I^2 \cdot R \cdot t)/(Cp \cdot \rho \cdot A \cdot L)$$
$$= (I^2 \cdot r \cdot L/A \cdot t)/(Cp \cdot \rho \cdot A \cdot L)$$
$$= (I^2 \cdot r \cdot t)/(Cp \cdot \rho \cdot A^2)$$

wherein Cp represents specific heat capacity; M is mass; R is resistance; ρ is density; L is length; and r is electric resistivity.

The formula (X) shows that the temperature increase ΔT is greater as the metal member has smaller specific heat capacity (Cp), smaller density (ρ), and larger electric resistivity (r) in terms of properties, and smaller cross-sectional area (A) in terms of the shape. The formula (X) also shows that if the heat dissipation is small enough to be ignored, the temperature increase ΔT does not depend on the length (L) of the first conductive material 35.

Table 1 shows the results of calculation of the temperature increase ΔT caused by the Joule heat (E) after time t has passed since a current (I) flowed in the first conductive material 35 in the case where aluminum, zinc, and tin which have a low melting point are used as the metal material for the first conductive material 35.

TABLE 1

| MATERIAL | MELTING POINT °C | SPECIFIC HEAT CAPACITY Cp J/kg/K | DENSITY ρ kg/m³ | ELECTRIC RESISTIVITY r Ωm | LENGTH L mm | CROSS-SECTIONAL AREA A mm² | CURRENT I A |
|---|---|---|---|---|---|---|---|
| ALUMINUM | 660 | 900 | 2,700 | 2.65E−08 | 15 | 0.1 | 30 |
| ALUMINUM | 660 | 900 | 2,700 | 2.65E−08 | 15 | 0.2 | 50 |
| ZINC | 420 | 390 | 7,140 | 6.02E−08 | 15 | 0.1 | 20 |
| ZINC | 420 | 390 | 7,140 | 6.02E−08 | 15 | 0.2 | 30 |
| TIN | 232 | 228 | 7,310 | 1.09E−07 | 15 | 0.3 | 20 |
| TIN | 232 | 228 | 7,310 | 1.09E−07 | 15 | 0.4 | 30 |

| MATERIAL | TIME t sec | MASS M = ρ·A·L kg | RESISTANCE $R_{f1} = r \cdot L/A$ Ω | ENERGY $E = I^2 \cdot R_{f1} \cdot t$ J | TEMPERATURE INCREASED ΔT = E/M/Cp °C |
|---|---|---|---|---|---|
| ALUMINUM | 1 | 4.05E−06 | 3.98E−03 | 3.58 | 981 |
| ALUMINUM | 1 | 8.10E−06 | 1.99E−03 | 4.97 | 682 |
| ZINC | 1 | 1.07E−05 | 9.03E−03 | 3.61 | 865 |
| ZINC | 1 | 2.14E−05 | 4.52E−03 | 4.06 | 486 |
| TIN | 1 | 3.29E−05 | 5.45E−03 | 2.18 | 291 |
| TIN | 1 | 4.39E−05 | 4.09E−03 | 3.68 | 368 |

As shown in Table 1, in the case, for example, aluminum is used as the metal material for the first conductive material 35, and the cross-sectional area (A) of the metal material is 0.1 mm², the temperature increase ΔT at the current (I=30 A) expected to flow in the event of an internal short-circuit is 981° C., which is higher than the melting point of aluminum (660° C.). This suggests that the first conductive material 35 having such a cross-sectional area is melted within one second when the internal short-circuit occurs. Thus, the first conductive material 35 made of aluminum having such a cross-sectional area can serve as a fuse in the event of an internal short-circuit, while also serving as a connecting member connecting the cells 10 arranged in the row direction together in parallel during a normal operation. That is, the first conductive material 35 made of aluminum having such a cross-sectional area can serve as a first fusible link whose fuse current $I_{f1}$ is 30 A. Further, in the case where the length (L) of the first conductive material 35 connecting the cells 10 is 15 mm, the resistance $R_{f1}$ of the first fusible link is about 5 mΩ, and the current flowing in the row direction at a time of discharge is small, that is, 0.1 A or less. Thus, a voltage drop caused by the current flowing in the first fusible link is very small, that is 0.5 mV or so. This small voltage drop has a minimal effect on the characteristics of the battery module.

Further, as shown in Table 1, also in the case where zinc or tin, other than aluminum, is used as the metal material for the first conductive material 35, it is possible to obtain a first fusible link whose fuse current is in a range of from 20 A to 30 A, and resistance is in a range of from 5 mΩ to 10 mΩ.

Figure 10:
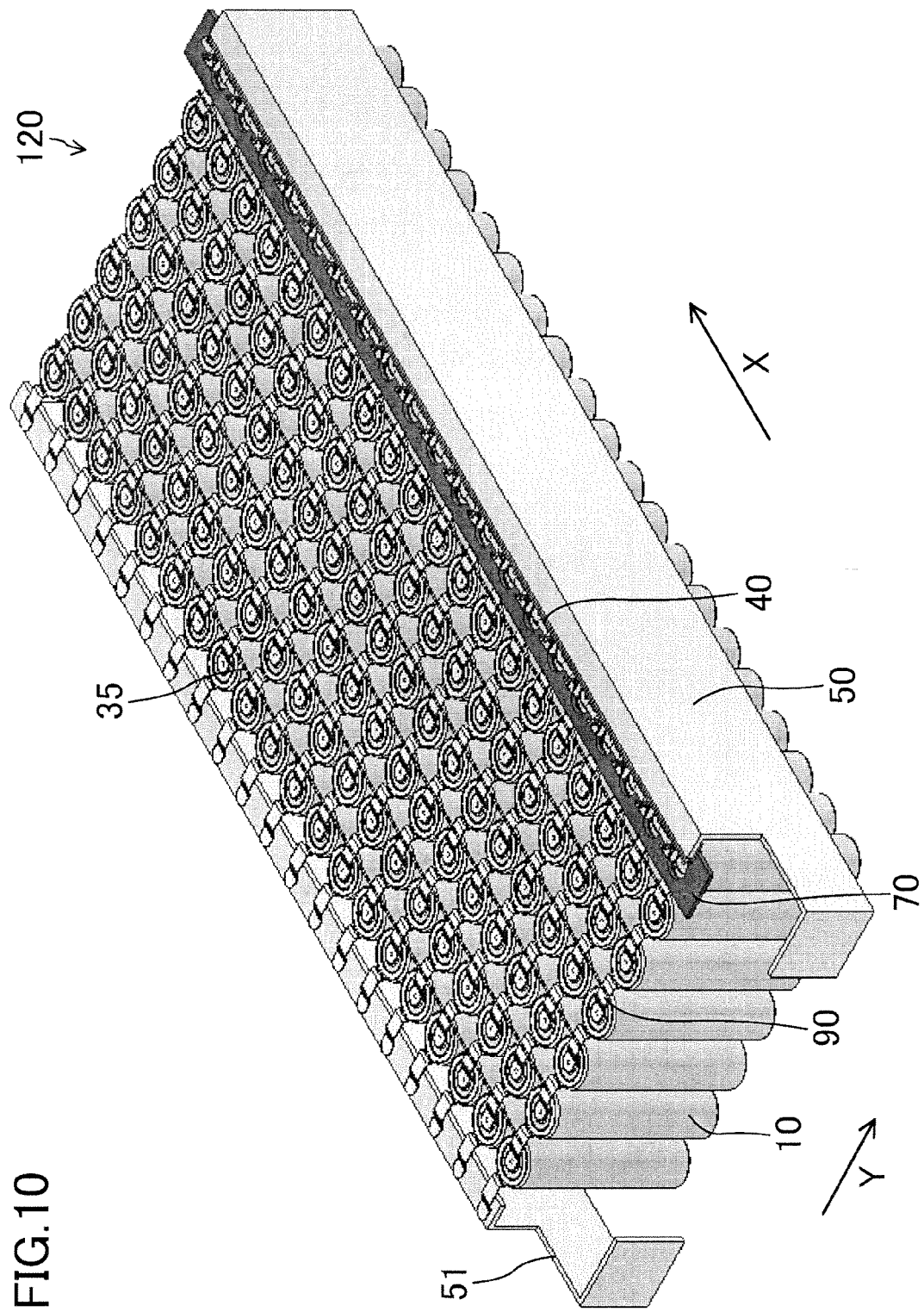
FIG. 10 is an oblique view of a configuration of the battery module according to the third embodiment.
Figure 11:
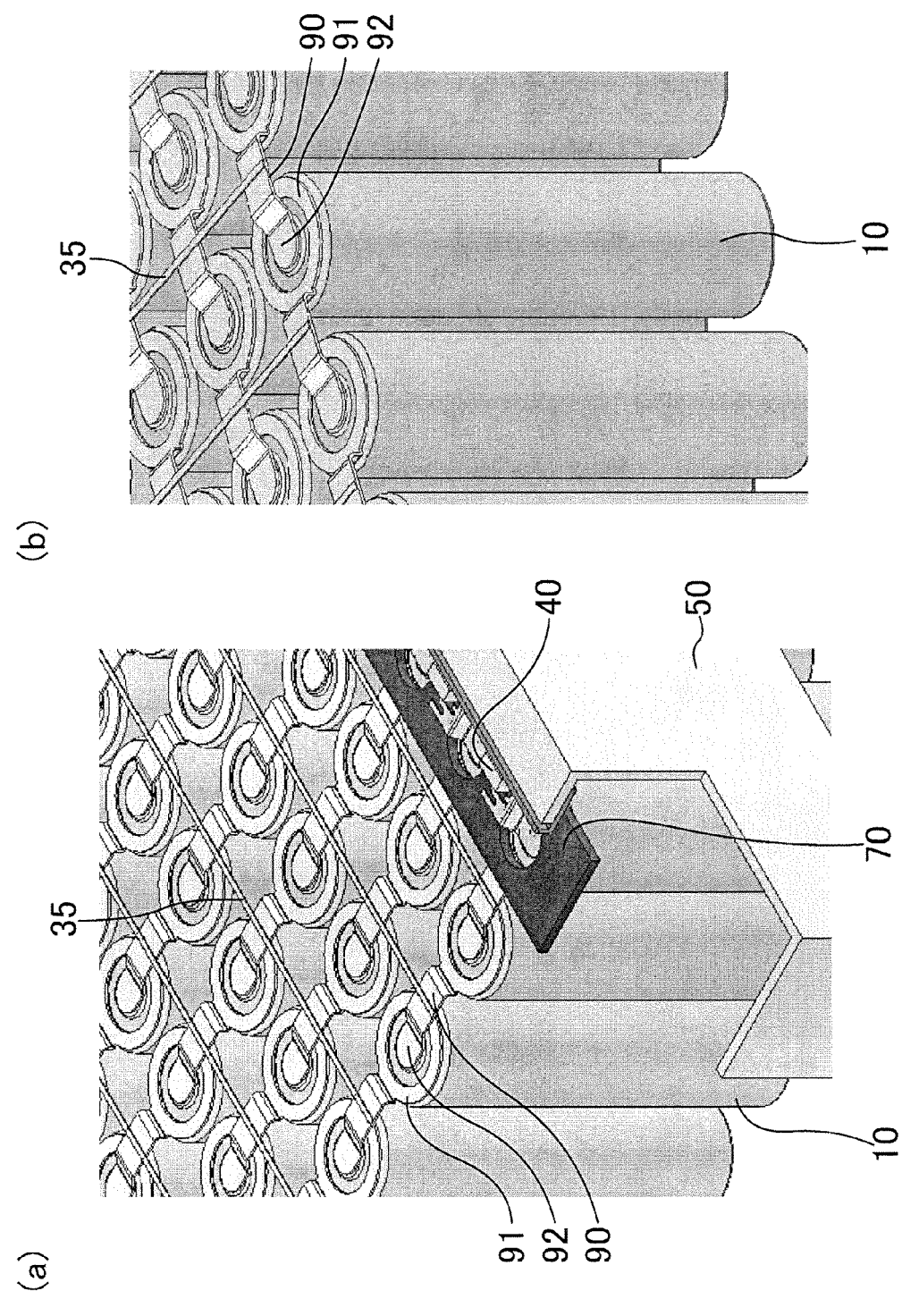
FIGS. 11(a) and 11(b) show enlarged views of parts of the battery module shown in FIG. 10.

Now, a concrete configuration of the battery module 120 according to the present embodiment will be described with reference to FIG. 10 and FIG. 11. FIG. 10 is an oblique view of a configuration of the battery module 120 according to the present embodiment. FIGS. 11(a) and 11(b) show enlarged views of parts of the battery module 120 shown in FIG. 10.

As shown in FIG. 10, similar to the battery module shown in FIG. 4, a plurality of cells 10 are arranged in a grid array in the battery module 120 according to the present embodiment. In the present embodiment, the periphery of the battery case of the cell 10 is not insulated, and a negative electrode terminal of a cell 10 can be located on the upper surface of the same cell 10 where a positive electrode terminal is located.

The second conductive material 90 which connects, in series, the cells 10 adjacent to each other in the column direction (Y direction) includes a portion 91 connected to a negative electrode terminal on the upper surface of a cell 10, and a portion 92 extending from the upper surface of the cell 10 to the upper surface of an adjacent cell 10 and connected to the positive electrode terminal of the adjacent cell 10, as shown in FIG. 11(a) and FIG. 11(b). The portion 91 connected to the negative electrode terminal is in the shape of a ring along the periphery of the upper surface of the cell 10. Further, the first conductive material 35 which connects, in parallel, the cells 10 arranged in the row direction (X direction) is connected to the second conductive materials 90 each connecting between the cells 10 adjacent to each other in the column direction. If the first conductive material 35 is made of metal wire or metal ribbon, the metal wire or the metal ribbon can be connected to each of the second conductive materials 90 by wire bonding.

The present disclosure has been described in terms of preferable embodiments. However, the above description does not limit the present disclosure, and of course, various modification can be made. For example, a plurality of battery blocks 60, each being comprised of (m×n) cells 10 connected in series/parallel, are connected in series in the column direction in the second present embodiment, but the plurality of battery blocks 60 may be connected in parallel in the row direction.

INDUSTRIAL APPLICABILITY

The present disclosure is useful as a power source for driving a vehicle, an electric motorcycle, electric play equipment, etc.

DESCRIPTION OF REFERENCE CHARACTERS 10 cell
20 series block
30 first fusible link
31 connecting member
35 first conductive material (first fusible link)
40 second fusible link
50 input/output terminal (positive electrode input/output terminal)
51 negative electrode input/output terminal
52 block connecting member
60 battery block
70 circuit board
80 connecting member
90 second conductive material
100, 110, 120 battery module

The invention claimed is:

1. A battery module having a plurality of cells arranged in a matrix, wherein
   m cells are connected in series in a column direction to form a series block, in which the cells adjacent to each other are connected to each other without a fusible link provided therebetween,
   the series block includes n series blocks arranged in a row direction, and the cells adjacent to each other in the row direction are connected in parallel via a first fusible link,
   the cell located at one end of each of the series blocks is connected to a common input/output terminal via a second fusible link, and
   the number m of the cells arranged in the column direction and the number n of the series blocks arranged in the row direction satisfy the following formulas (1) and (2)

[formula 1]
$$m \leq \frac{1}{2}\left(\frac{V_c}{R_c I_{f1}} - \frac{R_{f1}}{R_c} + 3\right) \quad (1)$$

[formula 2]
$$n \geq \frac{V_c + I_{f2} R_c}{V_c - (m-1) I_{f2} R_c} \quad (2)$$

where $V_c$ represents an electromotive voltage of the cell; $R_c$ represents an internal resistance of the cell; $R_{f1}$ represents a resistance of the first fusible link; $I_{f1}$ represents a fuse current of the first fusible link; and $I_{f2}$ represents a fuse current of the second fusible link.

2. The battery module of claim 1, wherein
   a plurality of battery blocks each of which includes the m×n cells arranged in a matrix are connected in series in the column direction, and
   the cell located at one end of each of the battery blocks in the column direction except for the battery block connected to the input/output terminal is connected to a common block connecting member via the second fusible link.

3. The battery module of claim 1, wherein
   the number m of the cells arranged in the column direction and the number n of the series blocks arranged in the row direction satisfy the following formulas (3) and (4), instead of the formulas (1) and (2)

[formula 3]
$$m \leq \frac{1}{2}\left(\frac{V_c}{R_c I_{f1}} - \frac{R_{f1}}{R_c}\right) \quad (3)$$

-continued

[formula 4]

$$n \geq \frac{mI_{f2}R_c}{V_c - mI_{f2}R_c} \quad (4)$$

where m≥10; n≥10; $V_c$ represents an electromotive voltage of the cell; $R_c$ represents an internal resistance of the cell; $R_{f1}$ represents a resistance of the first fusible link; $I_{f1}$ represents a fuse current of the first fusible link; and $I_{f2}$ represents a fuse current of the second fusible link.

4. The battery module of claim 1, wherein the resistance $R_{f1}$ of the first fusible link is larger than the internal resistance $R_c$ of the cell.

5. The battery module of claim 1, wherein
the cells arranged in the row direction are connected in parallel by a first conductive material, and the first conductive material forms the first fusible link, and
in an event that an internal short-circuit has occurred in the cell, the first conductive material is melted by Joule heat due to a short-circuit current flowing in the cell in which the internal short-circuit has occurred, via the first conductive material.

6. The battery module of claim 5, wherein
among the cells arranged in the column direction, the cells adjacent to each other in the column direction are connected in series by a second conductive material, and
the first conductive material is connected to the second conductive material connecting the cells adjacent to each other in the column direction.

7. The battery module of claim 6, wherein
the first conductive material is made of a metal wire or a metal ribbon, and
the metal wire or the metal ribbon is connected to the second conductive material connecting the cells adjacent to each other in the column direction by wire bonding.

8. The battery module of claim 1, wherein each of the cells is a lithium ion secondary battery.

* * * * *